United States Patent [19]

Alpaugh et al.

[11] Patent Number: 5,311,660
[45] Date of Patent: May 17, 1994

[54] METHYL CHLOROFORM-FREE DESMEAR PROCESS IN ADDITIVE CIRCUITIZATION

[75] Inventors: Warren A. Alpaugh, Chenango Forks; Anilkumar C. Bhatt, Johnson City; Michael J. Canestaro, Endicott; Robert J. Day, Dryden; Edmond O. Fey, Vestal; John E. Larrabee, Conklin, all of N.Y.

[73] Assignee: International Business Machines Corporation, Armonk, N.Y.

[21] Appl. No.: 15,742

[22] Filed: Feb. 10, 1993

[51] Int. Cl.[5] .............................................. H01K 3/10
[52] U.S. Cl. ....................................... 29/852; 139/26; 139/30; 156/644; 427/306; 427/307
[58] Field of Search ................. 427/306, 307, 309; 29/852; 156/644; 134/28, 30

[56] References Cited

U.S. PATENT DOCUMENTS

| | | | |
|---|---|---|---|
| 3,758,332 | 9/1973 | Dinella et al. | 427/307 X |
| 3,808,028 | 4/1974 | Lando | 427/306 X |
| 4,155,775 | 5/1979 | Alpaugh et al. | 156/644 X |
| 4,425,380 | 1/1989 | Nuzzi et al. | 427/307 X |
| 4,597,988 | 7/1986 | Kukanskis et al. | 427/307 X |
| 4,756,930 | 7/1988 | Kukanskis et al. | 427/307 X |
| 4,830,880 | 5/1989 | Okubi et al. | 427/306 X |
| 5,032,427 | 7/1991 | Kukanskis et al. | 427/306 |

OTHER PUBLICATIONS

"Polymers and Polymer Based Composites for Electronic Applications," George P. Schmitt, Bernd K. Applet and Jeffrey T. Gotro, pp. 334-371 in Seraphim, Lasky, and Li, *Principles of Electronic Packaging.*

"Printed Circuit Board Packaging", Donald P. Seraphim, Donald E. Barr, William T. chen, George P. Schmitt, and Rao R. Tummala, pp. 853-922, in Tummala and Rymaszewski, *Microelectronics Packaging Handbook.*

Primary Examiner—Carl J. Arbes
Attorney, Agent, or Firm—Richard M. Goldman

[57] ABSTRACT

Disclosed is a method of drilling, desmearing, and additively circuitizing a printed circuit board. The printed circuit board is drilled under conditions which produce glass and polymer smeared vias and through holes. The particulate debris is removed by vapor blasting the drilled printed circuit board. Next the printed circuit board is soaked in a solvent to swell the drill smear on the circuit interplanes of the printed circuit board. This solvent is then removed by entrainment in a gas, and a stream of an aqueous, acidic, oxidizing solution is passed through the printed circuit board holes to remove swollen smear in the thru holes and produce an etchback of conductors. After a water rinse an aqueous reducing solution is passed through the printed circuit board to reduce and remove aqueous acidic oxidizing solution, e.g., residual aqueous acid oxidizing solution. The printed circuit board is rinsed to remove the aqueous reducing solution. The surface of the printed circuit board is then seeded, the intended circuitization is photolithographically defined on the printed circuit board, and the circuitization, including the surface circuitization and the plated through hole circuitization, is additively plated.

10 Claims, 3 Drawing Sheets

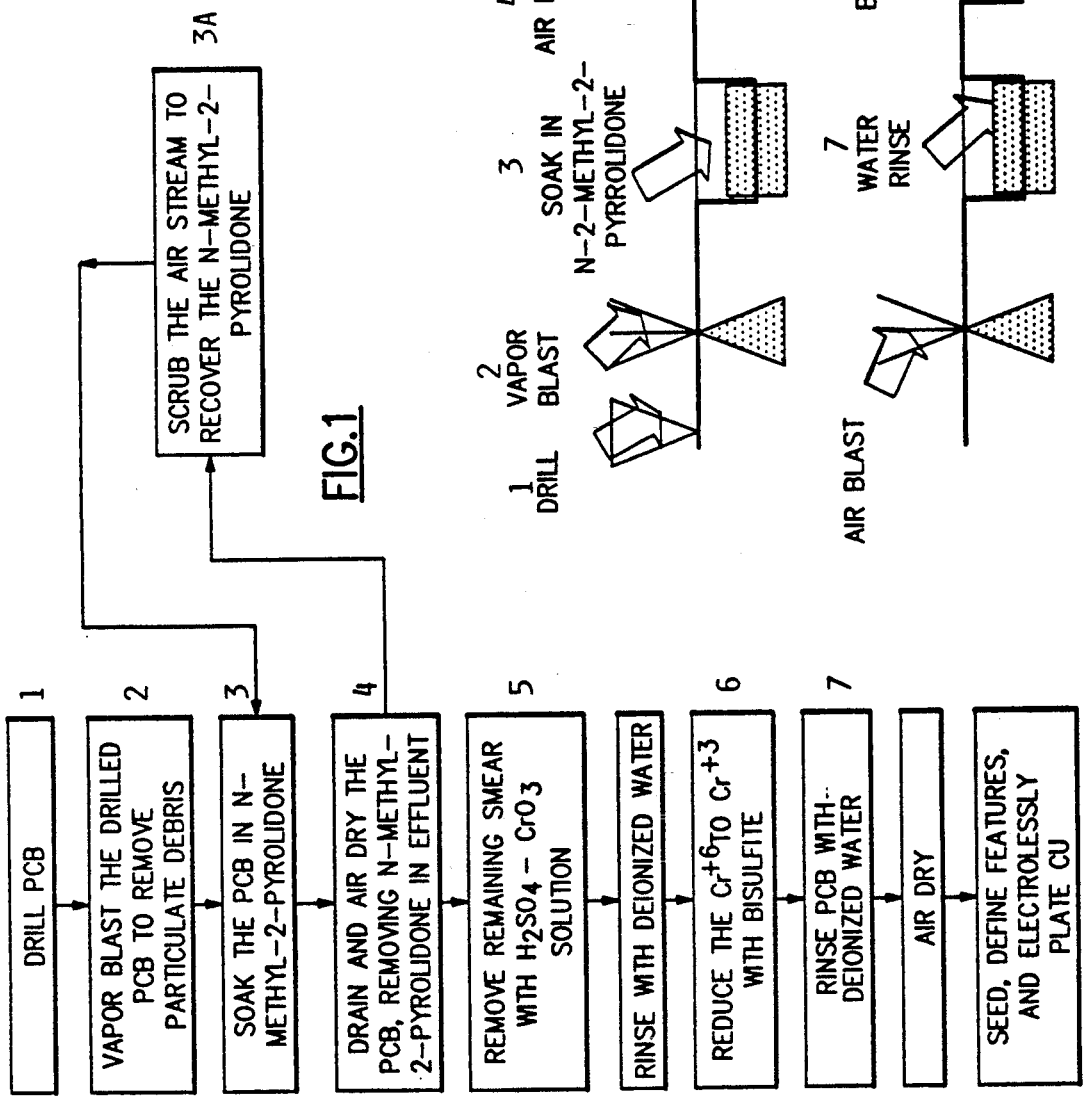

METHYL CHLOROFORM-FREE DESMEAR PROCESS IN ADDITIVE CIRCUITIZATION

FIELD OF THE INVENTION

The invention relates to the fabrication of microelectronic circuit packages. The circuit packages have X-Y plane (surface and internal) circuitization and Z-axis (vias and through holes) circuitization. Generally, the metallization is multi-layer, with a palladium seed layer deposited on the dielectric surface, and a copper circuitization layer deposited atop the palladium seed layer.

The vias and through holes are prepared by drilling through the substrate, desmearing the drilled holes, and plating the via and through hole walls to impart electrical conductivity thereto. One problem encountered in drilling, desmearing, and plating the vias and through holes is the incompatibility of the swelling reagents with the oxidizing materials used in subsequent processing steps. It has heretofore been necessary to utilize halocarbons, such as methyl chloroform, to remove the swelling agents.

Specifically, the swelling agents react with the $CrO_3$ used in a subsequent step, requiring an increased rate of oxidizing agent make-up.

In additive circuitization, a Pd "seed" layer is applied onto the surface of the substrate, and photoresist is applied atop the "seed" palladium, imaged, and developed to expose areas where circuitization is to be applied. The circuitization, i.e., copper circuitization, is deposited atop the seed layer, between walls of photoresist.

According to the invention the drill smear is removed by a carefully monitored process that eliminates the need for ozone depleting solvents, such as methyl chloroform, and instead utilizes a vapor blast of the drilled printed circuit board to remove the particulate residue, followed by a soaking in N-methyl-2-pyrrolidone,

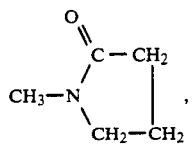

or other suitable solvent, such as N,N-dimethyl formamide, or dimethyl sulfoxide to "swell" the smear on the circuit interplanes of the board, increasing its susceptibility to attack by the oxidizing medium. This swelling solvent is removed from the printed circuit board by mechanical means, for example by a relatively long air blow, where the air stream is scrubbed to remove and recover the N-methyl-2-pyrrolidone, or other solvent. Following the removal of the N-methyl-2-pyrrolidone, an aqueous acidic oxidizing solution is fed, e.g., gravity fed, through the printed circuit board. One preferred aqueous acidic oxidizing solution is aqueous $H_2SO_4$—$CrO_3$. The oxidizing agent is fed through the printed circuit board holes to remove smear in the thru holes and produce an etchback of the exposed interplanar conductors.

This $H_2SO_4$—$CrO_3$ is reduced and removed, e.g., by a water rinse followed by bisulfite reduction, where the $Cr^{+6}$ is reduced to $Cr^{+3}$ by gravity feeding sodium bisulfite through the printed circuit board. The printed circuit board is rinsed with (deionized) water and, optionally, blown dry.

Before photolithographic definition, the through holes and surface features are seeded, for example, with a colloidal Pd/Sn solution.

BACKGROUND OF THE INVENTION

The general structures and manufacturing processes for electronic packages are described in, for example, Donald P. Seraphim, Ronald Lasky, and Che-Yo Li, *Principles of Electronic Packaging*, McGraw-Hill Book Company, New York, N.Y., (1988), and Rao R. Tummala and Eugene J. Rymaszewski, *Microelectronic Packaging Handbook*, Van Nostrand Reinhold, New York, N.Y. (1988), both of which are hereby incorporated herein by reference.

As described by Seraphim et al., and Tummala et al., an electronic circuit contains many individual electronic circuit components, e.g., thousands or even millions of individual resistors, capacitors, inductors, diodes, and transistors. These individual circuit components are interconnected to form the circuits, and the individual circuits are further interconnected to form functional units. Power and signal distribution are done through these interconnections. The individual functional units require mechanical support and structural protection. The circuits require electrical energy to function, and the removal of thermal energy to remain functional. Microelectronic packages, such as, chips, modules, circuit cards, circuit boards, and combinations thereof, are used to protect, house, cool, and interconnect circuit components and circuits.

Within a single integrated circuit, circuit component to circuit component and circuit to circuit interconnection, heat dissipation, and mechanical protection are provided by an integrated circuit chip. This chip is referred to as the "zeroth" level of packaging, while the chip enclosed within its module is referred to as the first level of packaging.

There is at least one further level of packaging. The second level of packaging is the circuit card. A circuit card performs at least four functions. First, the circuit card is employed because the total required circuit or bit count to perform a desired function exceeds the bit count of the first level package, i.e., the chip. Second, the circuit card provides for signal interconnection with other circuit elements. Third, the second level package, i.e., the circuit card, provides a site for components that are not readily integrated into the first level package, i.e., the chip or module. These components include, e.g., capacitors, precision resistors, inductors, electromechanical switches, optical couplers, and the like. Fourth, the second level package provides for thermal management, i.e., heat dissipation.

There is frequently a third level of packaging. This is the "board." The board carries both first and second level packages.

Packages may be characterized by the material used as the dielectric, i.e., as ceramic packages or as polymeric packages. The basic process for polymer based composite package fabrication is described by George P. Schmitt, Bernd K. Appelt and Jeffrey T. Gotro, "Polymers and Polymer Based Composites for Electronic Applications" in Seraphim, Lasky, and Li, *Principles of Electronic Packaging*, pages 334–371, previously incorporated herein by reference, and by Donald P. Seraphim, Donald E. Barr, William T. Chen, George P. Schmitt, and Rao R. Tummala, "Printed Circuit Board Packaging" in Tummala and Rymaszewski, *Microelectronics Packaging Handbook*, pages 853–922, also previously incorporated herein by reference.

In the normal process for package fabrication a fibrous body, such as a non-woven mat or woven web, is impregnated with a resin. This step includes coating the fibrous body with, for example, an epoxy resin solution, evaporating the solvents associated with the resin, and partially curing the resin. The partially cured resin is called a B-stage resin. The body of fibrous material and B stage resin is called a prepreg. The prepreg, which is easily handled and stable, may be cut into sheets for subsequent processing.

Typical resins used to form the prepreg include epoxy resins, cyanate ester resins, polyimides, hydrocarbon based resins, and fluoropolymers. One epoxy prepreg is the FR-4 prepreg. FR-4 is a fire retardant epoxy-glass cloth material, where the epoxy resin is the diglycidyl e: . - of 2,2'- bis(4-hydroxyphenyl) propane. This epoxy resin is also known as the diglycidyl ether of bisphenol-A, (DGEBA). The fire retardancy of the FR-4 prepreg is obtained by including approximately 15–20 weight percent bromine in the resin. This is done by partially substituting brominated DGEBA for the DGEBA.

Other epoxy resin formulations useful in providing prepregs include high functionality resins, such as epoxidized cresol novolacs, and epoxidized derivatives of triphenyl methane. The multifunctional epoxy resins are characterized by high glass transition temperatures, high thermal stability, and reduced moisture take up.

Still other epoxy resins are phenolic cured epoxies, as Ciba-Giegy RD86-170 ™, Ciba-Giegy RD87-211 ™, Ciba-Giegy RD87-212 ™, Dow Quatrex ® 5010 ™, Shell Epon ®, and the like. These epoxies are mixtures of epoxies, with each epoxy having a functionality of at least 2, a phenolic curing agent with a functionality of at least 2, and an imidazole catalyst.

Cyanate ester resins are also used in forming prepregs. One type of cyanate ester resin includes dicyanates mixed with methylene dianiline bis-maleimide. This product may be further blended with compatible epoxides to yield a laminate material. One such laminate material is a 50:45:5 (parts by weight) of epoxy: cyanate: maleimide. Typical of cyanate ester resins useful in forming prepregs is the product of bisphenol-A dicyanate and epoxy, which polymerizes during lamination to form a crosslinked structure.

A still further class of materials useful in forming prepregs for rigid multilayer boards are thermosetting polyimides. While thermosetting polyimides exhibit high water absorption, and high cost, they have good thermal properties and desirable mechanical properties. The preferred polyimides for prepreg use are addition products such as polyimides based on low molecular weight bismaleimides.

Subsequent processing of polymeric substrates includes circuitization, that is, the formation of a Cu signal pattern or power pattern on the prepreg, or lamination of the prepreg to a power core. Circuitization may be additive or subtractive.

The above described package configuration can be circuitized by additive circuitization. In additive circuitization a thin film of a "seeding" layer, such as a thin film of palladium, is first applied to the substrate. The adhesion layer may be applied by various methods, including, by way of example, deposition from a colloidal Pd/Sn solution.

Subsequently, photoresist is applied atop the palladium "seed" layer, imaged, and developed to provide a pattern for circuit deposition. Copper circuitization is then plated onto the "seed" layer between wall of the organic, hydrophobic photoresist to provide the circuitization pattern on the surface of the package. The remaining photoresist is then stripped, leaving a thick copper plated circuitization pattern atop the thin Pd seed layer, and a thin Pd seed layer "background."

The composite printed circuit package is fabricated by interleaving cores (including signal cores, signal/signal cores, power cores, power/power cores, and signal/power cores) with additional sheets of prepreg, and surface circuitization. Holes, as vias and through holes, may be drilled in individual core structures, for example, before or after circuitization, as described above, or in partially laminated modules.

U.S. Pat. No. 4,155,775 to Warren Alpaugh, Michael Canestaro and Theron Ellis for Cleaning of High Aspect Ratio Through Holes In Multilayer Printed Circuit Boards (IBM) describes a printed circuit board process with holes drilled through an epoxy-glass panel, followed by a cleaning process and an electroless copper plating process. Alpaugh et al. describe a cleaning process for high aspect ratio through holes of multilayer printed circuit boards to remove any loosened fibrous material, epoxy, and the like, and also provides an inverted "T" structure in the printed circuit board at the interplanes of the internal conductive circuits within the printed circuit board.

According to the process of Alpaugh et al. the drilled (and smeared) printed circuit board is subjected to the following process steps.

a. After drilling, the printed circuit board is vapor blasted, for example, with a high pressure blast of a particulate slurry in water.

b. Vapor blasting is followed by soaking the printed circuit board in a suitable solvent to swell smears on the circuit interplanes of the board. Exemplary solvents are N-methyl-2-pyrrolidone, N,N-dimethyl formamide, and dimethyl sulfoxide. Alpaugh et al. disclose that N-methyl-2-pyrrolidone is preferred.

c. The excess solvent is removed from the printed circuit board. This is accomplished by feeding, e.g., gravity feeding, 100% methylchloroform (1,1,1-trichloroethane, $CCl_3-CH_3$). This is disclosed to be a four minute soak followed by a 90 second air blow. The air blow is a source of atmospheric methylchloroform, an ozone depleter.

d. A unilateral stream of a cleaning solution is fed through the printed circuit board holes to remove excess fibers and smear in the holes and produce an etchback of the conductors. An exemplary cleaning solution is chrome/sulfuric acid, for example 40%–50% $H_2SO_4$, 50–80 grams/liter $CrO_3$.

e. The cleaning solution is then rinsed off, reduced, and removed. Alpaugh et al. disclose that in this step the $Cr^{+6}$ is reduced to $Cr^{+3}$ by gravity feeding sodium bisulfite through the printed circuit board.

f. Alpaugh et al. further disclose that the printed circuit board is rinsed with (deionized) water and blown dry.

The methylchloroform rinse serves three purposes. First, it removes the solvent (e.g., N-methyl-2-pyrrolidone, N-dimethyl formamide, or dimethyl sulfoxide), which is incompatible with (1) the $H_2SO_4/CrO_3$ desmearing bath, and, to a lesser extent, (2) the copper plating bath. Second, while the methylchloroform is, itself detrimental to the $H_2SO_4/CrO_3$ desmearing bath, it is easily removed by air blasts. Third, absent the ozone depletion effect, methylchloroform is an ideal agent for removing the (N-methyl-2-pyrrolidone, N-dimethyl formamide, or dimethyl sulfoxide) solvent, since it does not plasticize the printed circuit board, and is neither explosive nor flammable.

To be noted is that methylchloroform (MCF) is a unique solvent that does not kill the swelling, is volatile, and is not flammable at the conditions of processing printed circuit boards. This combination of properties is unique to MCF among solvents.

Alternatives to methylchloroform are the low boiling solvents, e.g., methyl ethyl ketone (MEK) and isopropyl alcohol are flammable and explosive. Another low boiling solvent, methylene chloride (MC) is non-flammable, but toxic. High boiling solvents could not be easily removed, and would poison the $H_2SO_4/CrO_3$ desmearing bath. Methylene chloride is not flammable, but is not as effective as methyl chloroform.

Thus, there is a need for an additive circuitization process which avoids the use of ozone depleting halohydrocarbons, flammable solvents, and contaminants that poison the copper solution. Preferably the process is compatible with present installed process equipment and presently utilized materials.

Objects Of The Invention

It is one object of the invention to provide packages, especially high density cards, boards, and other packages, prepared by an additive plating process.

It is a further object of the invention to provide additive circuitization process which avoids the use of ozone depleting halohydrocarbons, flammable solvents, and contaminants that poison the additive circuitization process.

It is a still further object of the invention to provide an additive circuitization process that is compatible with presently installed process equipment and presently utilized materials.

SUMMARY OF THE INVENTION

These and other objects are obtained by the microelectronic circuit package fabrication method of the invention. The fabrication method is useful for fabricating a microelectronic package having copper circuitization.

Specifically, the method of the invention provides packages, especially high density cards, boards, and other packages, having additive circuitization. The integrated, multi-step hole cleaning segment of the additive circuitization process not only avoids the use of ozone depleting hydrohalocarbons, but also avoids the use of substitute flammable solvents, and substitute solvents that are contaminants, poisoning the additive circuitization process. Moreover, the additive circuitization process disclosed herein is compatible with presently installed process equipment and presently utilized materials.

According to the method of the invention the drilling and circuitization includes the steps of:

a. Drilling the printed circuit board, which results in residue, including glass and polymer smear;

b. Vapor blasting the drilled printed circuit board to remove the particulate residue;

c. Vapor blasting is followed by soaking the printed circuit board in N-methyl-2-pyrrolidone,

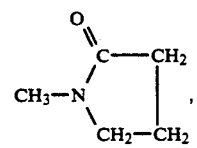

or another suitable solvent, such as N-dimethyl formamide, or dimethyl sulfoxide to swell the smear on the circuit interplanes of the board;

d. The excess solvent is removed from the printed circuit board. This is accomplished by a relatively long air blow;

d.' Optionally, the air stream is scrubbed to remove and recover the N-methyl-2-pyrrolidone, or other solvent;

d." Optionally the long air blow is done with heated air;

e. A stream of $H_2SO_4$—$CrO_3$ cleaning solution is fed through the printed circuit board holes to remove excess fibers and smear in the thru holes and produce an etchback of the conductors;

f. The cleaning solution is then reduced and removed by a subsequent water rinse followed by treatment with a reducing agent, e.g., by bisulfite reduction, where the $Cr^{+6}$ is reduced to $Cr^{+3}$ by feeding sodium bisulfite through the printed circuit board;

g. The printed circuit board is rinsed with (deionized) water and, optionally, blown dry;

h. The dried printed circuit board is then "seeded" with a colloidal Pd/Sn solution to form a Pd "seed" layer;

i. After photolithographic definition, the through holes and surface features are additively plated, e.g., with (a) (i) Cu sulfate, (ii) formaldehyde, (iii) sodium hydroxide, (iv) either (a) Na/K tartrate (Rochelle Salt) complexant, or (b) EDTA-ethylene diamine tetra-acetic acid complexant, (v) at an alkaline pH of about 11; or with (b) Copper sulfate and DMAB, or with (c) Copper sulfate and sodium hypophosphite. Other additives may also be present, as, for example, $CN^-$, to improve the properties of the copper plate.

THE FIGURES

The invention may be understood by reference to the Figures.

FIG. 1 is a flow chart of the method of the invention.

FIG. 2 is a schematic diagram of the method of the invention.

DETAILED DESCRIPTION OF THE INVENTION

Figures 3, 4, 5:
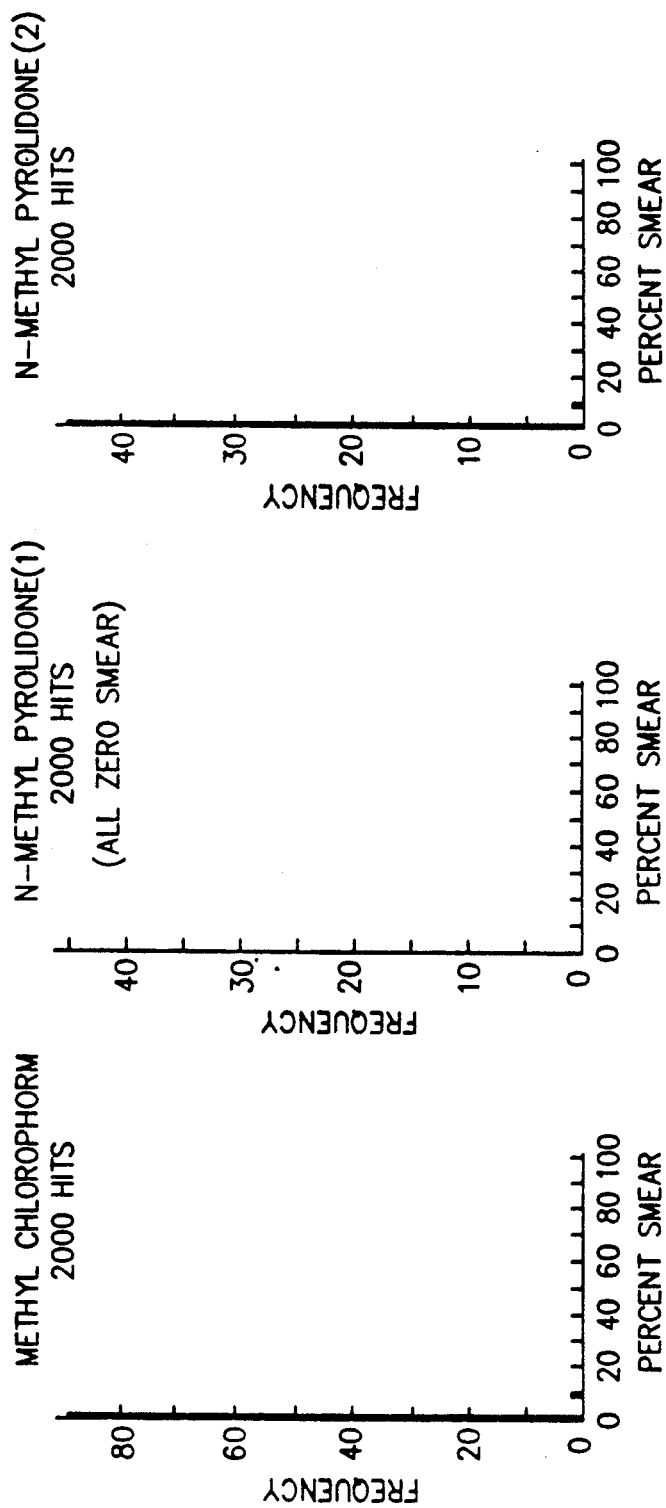
FIGS. 3 through 8 are graphical representations of the data in Table II.
Figure 8:
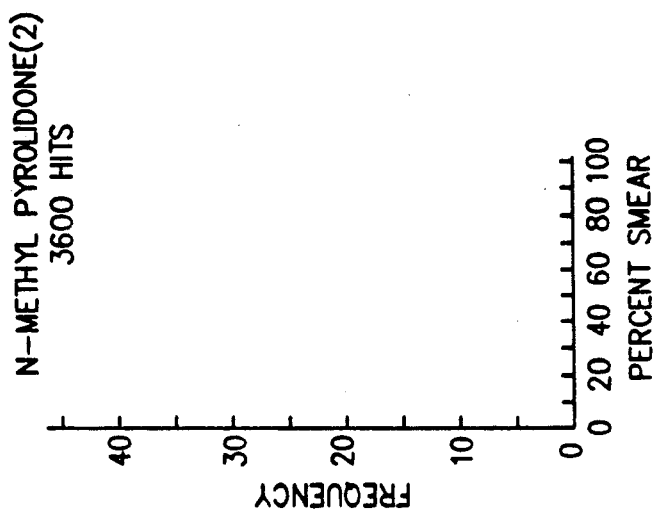
Figure 7:
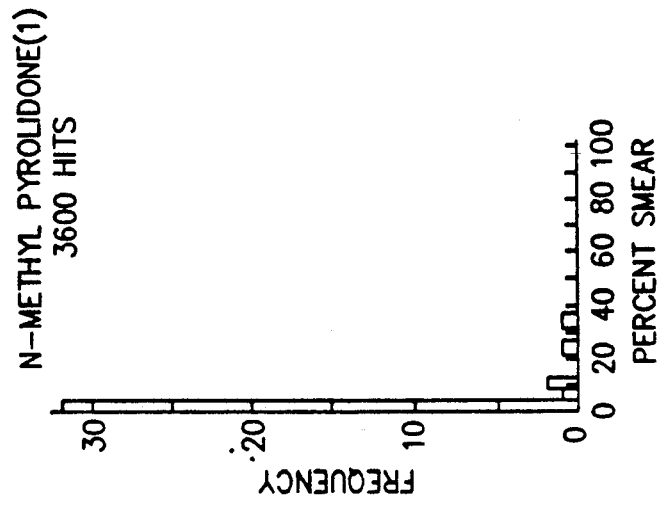
Figure 6:
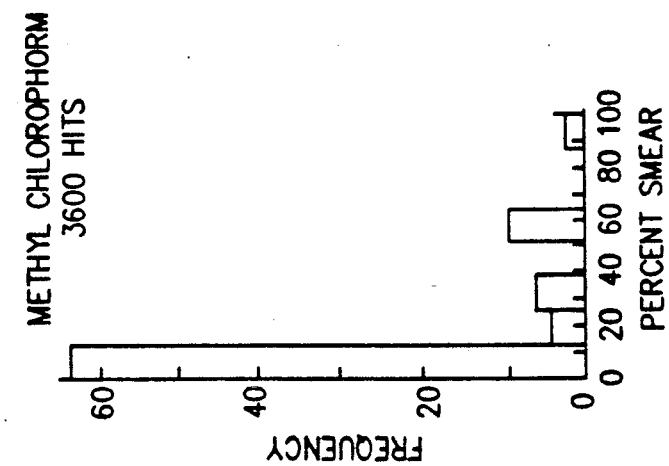

The method of the invention is illustrated in the flow chart of FIG. 1 and the schematic of FIG. 2. FIG. 1 illustrates a flow chart of a microelectronic circuit package fabrication having desmearing and recovery of the swelling solvent without the use of ozone depleting chemicals.

More specifically, the microelectronic circuit package fabrication of the invention starts with a circuit panel or board substrate in which the through holes are drilled out. This is shown in block 1 of FIG. 1, and as the first work station in FIG. 2. The drilling process may be a punch process, a mechanical drilling process, or a laser drilling process. The drilling process results is drill smear, i.e., glass and polymer fragments, strands, and particles. These fragments, strands, and particles, referred to collectively as "drill smear," seriously degrade the electrical and mechanical contact within the through holes, and must be removed. Initial removal is by an air or vapor blast, as shown in block 2 of FIG. 1, and at station 2 of FIG. 2. However, much of the drill smear is strongly adherent to the hole walls.

Thus, it is necessary after the drilling and vapor blasting steps to remove the drill smear using a combination of a swelling solvent and a etching solvent. Exemplary solvents include N-methyl-2-pyrolidone,

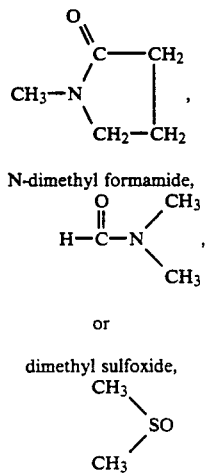

N-dimethyl formamide, or dimethyl sulfoxide,

These solvents are incompatible with materials used in subsequent processing steps and must be removed. Heretofore, the removal process has included the use of halocarbon solvents. However, halocarbon solvents have been reported to be ozone depleting gases, and must be removed from the environment.

As a first step in the removal of the solvent, air is blown through the printed circuit board to withdraw the solvent. This is shown in block 4 of FIG. 1 and at station 4 of FIG. 2. It should be noted that the exhaust gas stream is scrubbed to remove and recover the N-methyl-2-pyrrolidone, or other solvent. The scrubbing and recovery step is shown in box 3A of FIG. 1.

The gas jet is not wholly effective in removing the solvent and swollen smear to a low enough level to permit high conductivity contacts within the vias. Thus, it is necessary to remove the residual drill smear with a strong acidic oxidizing solution, as shown in Box 5 of FIG. 1 and station 5 of FIG. 2. One such oxidizing agent solution is an aqueous $H_2SO_4$—$CrO_3$ solution. This solution is fed, for example, gravity fed, through the printed circuit board holes to remove smear and loosened fibers in the holes and produce an etchback of the conductors. One exemplary cleaning solution is chrome/sulfuric acid, for example 40%-50% $H_2SO_4$, 50-80 grams/liter $CrO_3$.

This cleaning solution is followed by a water rinse, and then the oxidizing acid solution is reduced and removed as shown in block 6 of FIG. 1 and station 6 of FIG. 2. This can be accomplished by bisulfite reduction, where the $Cr^{+6}$ is reduced to $Cr^{+3}$. In this embodiment the sodium bisulfite is gravity fed through the printed circuit board.

Next, as shown in block 7 of FIG. 1 and station 7 of FIG. 2, the printed circuit board is rinsed with water, preferably deionized water and, optionally, blown dry. This removes mobile and/or reactive ionic species from the printed circuit board, and thereby permits additive circuitization.

Following the above described drilling, desmearing, solvent removal, and neutralization steps the printed circuit substrate is seeded with a colloidal Pd/Sn seeding solution and coated with resist. Thereafter, the resist is imaged, as by screening or lithography, to expose the substrate, that is, the adhesion and seeding layers of the panel, if present, intended to carry circuitization leads. The remainder of the card or board remains covered by resist, for additive circuitization.

After photolithographic definition, the through holes and surface features are additively plated, e.g., with (a) (i) Cu sulfate, approximately 12g/l, (ii) Formaldehyde Reducing Agent, approximately 8g/l, (iii) Sodium hydroxide, approximately 15g/l, (iv) either (i) Na/K Tartrate Rochelle Salt Complexant, approximately 11 g/l, or (ii) EDTA-ethylene diamine tetra-acetic acid complexant, approximately 11 to 40g/l, (v) at an alkaline pH of about 11, or with (b) Copper sulfate and DMAB, or with (c) Copper sulfate and sodium hypophosphite.

The method of the invention may be understood by reference to the following comparative example.

EXAMPLE

A series of tests were carried out on epoxy-glass printed circuit boards. These tests were intended to determine the effects of (1) eliminating the methylchloroform solvent wash, and (2) varying the duration of the air drying step.

For each of the three tests the printed circuit board was conventionally drilled. The initial drilling process resulted in glass and polymer smear in all of the printed circuit boards.

The drilled printed circuit boards were then vapor blasted to remove the particulate residue inside the drilled holes. Following vapor blasting the printed circuit boards were soaked in N-methyl-2-pyrrolidone to swell the smear and loosen and remove any fibers on the circuit interplanes of the boards. The N-methyl-2-pyrrolidone soak was carried out for the time shown in Table I.

The control printed circuit board was soaked in methylchlorform at room temperature (approximately 27 degrees C) for two 2 minute rinses. The N-methyl-2-pyrrolidone - only printed circuit boards were air dried for a time corresponding to the methylchloroform rinse of the control printed circuit board.

All of the printed circuit boards were treated with a solution of 50-80 grams/liter $CrO_3$ in aqueous 40%-50% $H_2SO_4$, $H_2SO_4$—$CrO_3$ cleaning solution. This solution was fed through the printed circuit board holes to etch the smear and remove excess fibers in the thru holes, produce etchback of the conductors, and remove remaining N-methyl-2-pyrrolidone.

The cleaning solution was then reduced and removed by two sequential aqueous sodium bisulfite rinses. In this step aqueous sodium bisulfite was gravity fed through the printed circuit board and the $Cr^{+6}$ was reduced to $Cr^{+3}$.

The printed circuit boards were then rinsed with deionized water and blown dry. The parameters for the printed circuit boards are shown in Table I, Sample Preparation.

Following sample preparation, the printed circuit boards were examined for smear in the through holes.

The results of this Examination are shown in FIG. 3 and Table II, *Drill Smear As A Function of Number Of Drill Hits and Method of Desmear*. Table II is divided into four parts, for 1000 drill hits, 1500 drill hits, 2000 drill hits, and 3600 drill hits. The first line in a section is the number of occurrences of smear in the samples. The next line is the percent of locations that had that amount of smear. The third and fourth lines are the cumulative occurrences of smear and the cumulative percent of smear.

FIGS. 3, 4, 5, 6, 7 and 8 are histogram representations of Table II, showing the percent smear for the parts of a function of number of drill hits for the thru hole cleaning process with methylchloroform (FIG. 3) and for the method of the invention (FIGS. 4, 5, 6, 7, and 8).

Samples drilled to 1000 drill hits were free of smear for all hole clean operations. The histogram for 2000 drill hits also shows that the parts were free of drill smear. However, the sample parts subjected to 3600 drill hits show that the results using the method of the invention were superior to the parts desmeared with methylchloroform.

TABLE I
SAMPLE PREPARATION

| DESCRIPTION | MCF SAMPLE | NMP SAMPLE I | NMP SAMPLE II |
| --- | --- | --- | --- |
| FIRST NMP WASH | ROOM TEMP, 2.5 MIN | ROOM TEMP, 2.5 MIN | — |
| SECOND NMP WASH | ROOM TEMP, 2.5 MIN | —[1] | ROOM TEMP, 2.5 MIN[2] |
| FIRST MCF WASH | ROOM TEMP, 2 MIN | — | — |
| SECOND MCF WASH | ROOM TEMP, 2 MIN | — | — |
| AIR DRY | ROOM TEMP, 1.5 MIN | ROOM TEMP, 1.5 MIN | ROOM TEMP, 1.5 MIN |
| HOLD IN AIR | 3 MIN | 3 MIN | 3 MIN |
| $CrO_3$—$H_2SO_4$ RINSE | 115°, SPECIFIC GRAVITY = 1.42, 70 SECONDS | 115°, SPECIFIC GRAVITY = 1.42, 70 SECONDS | 115°, SPECIFIC GRAVITY = 1.42, 70 SECONDS |
| DEIONIZED WATER RINSE | ROOM TEMP, 30 SEC | ROOM TEMP, 30 SEC | ROOM TEMP, 30 SEC |
| DEIONIZED WATER DRIP | 3 MIN | 3 MIN | 3 MIN |
| FIRST $NaHSO_3$ RINSE | ROOM TEMP, 1 MIN | ROOM TEMP, 1 MIN | ROOM TEMP, 1 MIN |
| FIRST $NaHSO_3$ DRIP | 2.5 MIN | 2.5 MIN | 2.5 MIN |
| SECOND $NaHSO_3$ RINSE | ROOM TEMP, 1 MIN | ROOM TEMP, 1 MIN | ROOM TEMP, 1 MIN |
| SECOND $NaHSO_3$ DRIP | ROOM TEMP, 2.5 MIN | ROOM TEMP, 2.5 MIN | ROOM TEMP, 2.5 MIN |
| SECOND DEIONIZED WATER RINSE | ROOM TEMP, 3 MIN | ROOM TEMP, 3 MIN | ROOM TEMP, 3 MIN |
| SECOND DEIONIZED WATER DRIP | 30 SECONDS | 30 SECONDS | 30 SECONDS |
| THIRD DEIONIZED WATER RINSE | ROOM TEMP, 2.5 MIN | ROOM TEMP, 2.5 MIN | ROOM TEMP, 2.5 MIN |
| THIRD DEIONIZED WATER DRIP | 1 MIN | 1 MIN | 1 MIN |
| AIR DRY (FORCED AIR) | ROOM TEMP, 4 MIN | ROOM TEMP, 4 MIN | ROOM TEMP, 4 MIN |

[1] NMP IMMERSION FOR 2.5 MINUTES FOLLOWED BY 12 MINUTES TOTAL AIR DRYING TIME.
[2] 2.5 MINUTE IMMERSION IN NMP FOLLOWED BY 9.5 MINUTE TOTAL AIR DRY.

TABLE II
DRILL SMEAR AS A FUNCTION OF NUMBER OF DRILL HITS AND METHOD OF DESMEAR

| DESCRIPTION | MCF SAMPLE | NMP SAMPLE I | NMP SAMPLE II |
| --- | --- | --- | --- |
| 1000 DRILL HITS | | | |
| SMEAR | 0 | 0 | 0 |
| FREQUENCY | 10 | 43 | 22 |
| PERCENT | 100% | 100% | 100% |
| CUMULATIVE FREQUENCY | 10 | 43 | 22 |
| CUMULATIVE PERCENT | 100% | 100% | 100% |
| 1500 DRILL HITS | | | |
| SMEAR | ******** | 0 | 0 |
| FREQUENCY | ******** | 29 | 58 |
| PERCENT | ******** | 100% | 100% |
| CUMULATIVE FREQUENCY | ******** | 29 | 58 |
| CUMULATIVE PERCENT | ******** | 100% | 100% |
| 2000 DRILL HITS | | | |
| SMEAR | 0/10 | 0/10 | 0 |
| FREQUENCY | 70/2 | 45/1 | 23 |
| PERCENT | 97.2%/2.8% | 97.8%/2.2% | 100% |

TABLE II-continued

DRILL SMEAR AS A FUNCTION OF NUMBER OF DRILL HITS AND METHOD OF DESMEAR

| DESCRIPTION | MCF SAMPLE | NMP SAMPLE I | NMP SAMPLE II |
|---|---|---|---|
| CUMULATIVE FREQUENCY | 70/72 | 45/46 | 23 |
| CUMULATIVE PERCENT | 97.2/100% | 97.8%/100% | 100% |
| 3600 DRILL HITS | | | |
| SMEAR | 0/5/10/15/20/50/90 | | 0/5 |
| FREQUENCY | 59/1/4/2/2/6/9/2/6 | | 89/1 |
| PERCENT | 65/1/4.5/2.2/2.2/6.6/10/2.2/6.6 | | 98.9%/1.1% |
| CUMULATIVE FREQUENCY | 59/60/64/66/68/74/83/85/91 | | 89/90 |
| CUMULATIVE PERCENTAGE | 65/66/70.5/72.7/74.9/81.5/91.5/93.7/100 | | 98.9%/100% |

To be noted is that the results obtained without methylchloroform were superior to the results obtained with methyl chloroform. Specifically, 97.8 percent and 100 percent of the vias and through holes were free of drill smear in the methylchloroform-free samples, while only 97.2 percent of the vias and through holes were smear free in the methyl chloroform samples.

While the invention has been described with respect to certain preferred embodiments and exemplifications, it is not intended to limit the scope of the invention thereby, but solely by the claims appended hereto.

We claim:

1. In a method of additive circuitization of a glass and polymer printed circuit board comprising the steps of:
   a. drilling the printed circuit board, thereby forming glass and polymer smeared holes;
   b. vapor blasting the drilled printed circuit board to remove particulate residue therefrom;
   c. soaking the printed circuit board in a solvent to swell the drill smear and to loosen and remove fibers from the internal circuit interplanes which intersect the drilled through holes of the printed circuit board;
   d. removing solvent from the printed circuit board;
   e. passing a stream of an aqueous, acidic, oxidizing solution through the printed circuit board holes to remove fibers and smears in the thru holes and produce an etchback of conductors;
   f. passing an aqueous reducing agent solution through the printed circuit board to reduce and remove the aqueous acidic oxidizing agent solution;
   g. rinsing the printed circuit board to remove the aqueous reducing agent solution;
   h. seeding the printed circuit board to form a seed layer on the surface thereof;
   i. photolithographically defining circuitization on the printed circuit board; and
   j. electrolessly plating through holes and surface features of the printed circuit board, the improvement comprising first passing a stream of heated air through the printed circuit board to remove the solvent from the printed circuit board by gas entrainment in the heated air before passing the aqueous, acidic oxidizing solution therethrough, and thereafter scrubbing the air to recover solvent therefrom.

2. The method of claim 1 wherein the solvent is chosen from the group consisting of: N-methyl-2-pyrolidone,

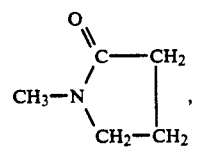

N-dimethyl formamide,

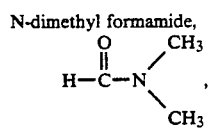

and dimethyl sulfoxide,

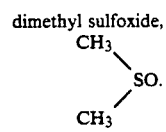

3. The method of claim 2 wherein the solvent is N-methyl-2-pyrolidone,

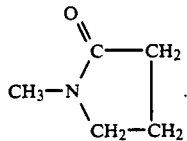

4. The method of claim 1 wherein the aqueous, acidic oxidizing solution passed through the printed circuit board holes to remove fibers and smear in the thru holes and produce an etchback of conductors is $H_2SO_4$—$CrO_3$.

5. The method of claim 4 wherein the $H_2SO_4$—$CrO_3$ is an aqueous chrome/sulfuric acid solution comprising 50–80 grams/liter $CrO_3$ in 40 weight % to 50 weight % aqueous $H_2SO_4$.

6. The method of claim 1 wherein the aqueous acidic oxidizing agent is reduced and removed by reaction with bisulfite.

7. The method of claim 1 wherein the aqueous, acidic, oxidizing solution passed through the printed circuit board holes to remove fibers and smear in the thru holes and produce an etchback to conductors is $H_2SO_4$—$CrO_3$, and the $Cr^{+6}$ is reduced to $Cr^{+3}$ by gravity feeding sodium bisulfite through the printed circuit board.

8. The method of claim 1 comprising additive electrolessly plating Cu onto the printed circuit board with an electroless plating solution chosen from the group consisting of:
   a. (i) Cu sulfate, (ii) Formaldehyde Reducing Agent, (iii) Sodium hydroxide, (iv) Na/K Tartrate Rochelle Salt Complexant, or EDTA-ethylene diamine tetra-acetic acid complexant, (v) at an alkaline pH of about 11;
   b. Copper sulfate and DMAB; and
   c. Copper sulfate and sodium hypophosphite.

9. In a method of additive circuitization of a glass and polymer printed circuit board comprising the steps of:
   a. drilling the printed circuit board, thereby forming glass and polymer smeared holes;
   b. vapor blasting the drilled printed circuit board to remove particulate residue therefrom;
   c. soaking the printed circuit board in a solvent to swell the drill smear and loosen and remove fibers, the solvent being chosen from the group consisting of: N-methyl-2-pyrolidone,

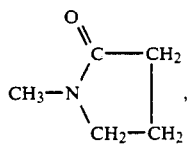

N-dimethyl formamide.

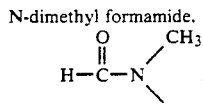

and dimethyl sulfoxide.

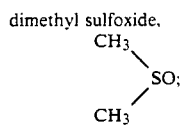

d. removing solvent from the printed circuit board;
   e. passing a stream of an aqueous, acidic $H_2SO_4$—$CrO_3$ oxidizing solution through the printed circuit board holes to remove fibers and smear in the thru holes and produce etchback of conductors;
   f. passing an aqueous sodium bisulfite reducing solution through the printed circuit board to reduce and remove the aqueous acidic solution and reduce the chromium from $Cr^{+6}$ to $Cr^{+3}$;
   g. rinsing the printed circuit board to remove the aqueous sodium bisulfite reducing solution;
   h. depositing a Pd seed layer on the printed circuit board;
   i. photolithographically defining circuitization on the printed circuit board; and
   j. additively plating through holes and surface features of the printed circuit board;

the improvement comprising first passing a stream of heated air through the printed circuit board to remove the solvent from the printed circuit board by gas entrainment in the heated air before passing the aqueous, acidic oxidizing solution therethrough, and thereafter scrubbing the air to recover solvent therefrom.

10. In a method of additive circuitization of a glass and polymer printed circuit board comprising the steps of:
   a. drilling the printed circuit board, thereby forming glass and polymer smeared holes;
   b. vapor blasting the drilled printed circuit board to remove particulate residue therefrom;
   c. soaking the printed circuit board in a swelling solvent for the drilling smear to swell the drilling smear and to loosen and remove fibers from the printed circuit board, the solvent being N-methyl-2-pyrolidone,

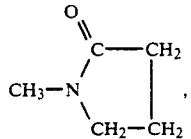

d. removing solvent from the printed circuit board;
   e. passing a stream of an aqueous, oxidizing, acidic $H_2SO_4$—$CrO_3$ solution through the printed circuit board holes to remove fibers and smear in the thru holes and produce etchback of conductors;
   f. passing an aqueous, reducing sodium bisulfite solution through the printed circuit board to reduce and remove the aqueous, oxidizing, acidic solution and reduce the chromium from $Cr^{+6}$ to $Cr^{+3}$;
   g. rinsing the printed circuit board to remove the aqueous, reducing sodium bisulfite solution;
   h. depositing a Pd seed layer on the printed circuit board;
   i. photolithographically defining circuitization on the printed circuit board; and
   j. additively plating through holes and surface features of the printed circuit board; the improvement comprising passing a stream of heated air through the printed circuit board to remove the solvent from the printed circuit board by gas entrainment in the heated air before passing the aqueous, acidic oxidizing solution therethrough, and thereafter scrubbing the air to recover solvent therefrom.

* * * * *